(12) United States Patent
Yang et al.

(10) Patent No.: US 10,217,633 B2
(45) Date of Patent: Feb. 26, 2019

(54) SUBSTANTIALLY DEFECT-FREE POLYSILICON GATE ARRAYS

(71) Applicant: GLOBALFOUNDRIES INC., Grand Cayman (KY)

(72) Inventors: Heng Yang, Ballston Spa, NY (US); Ahmed Hassan, Halfmoon, NY (US); Daniel Dechene, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 13 days.

(21) Appl. No.: 15/456,757

(22) Filed: Mar. 13, 2017

(65) Prior Publication Data

US 2018/0261456 A1 Sep. 13, 2018

(51) Int. Cl.
*H01L 21/76* (2006.01)
*H01L 21/033* (2006.01)
*H01L 21/768* (2006.01)

(52) U.S. Cl.
CPC .... *H01L 21/0337* (2013.01); *H01L 21/76816* (2013.01); *H01L 21/76837* (2013.01); *H01L 21/76885* (2013.01)

(58) Field of Classification Search
CPC ............ H01L 21/0337; H01L 21/3086; H01L 21/31144; H01L 21/0338; H01L 21/32139
USPC ........................................................ 438/669
See application file for complete search history.

(56) References Cited

U.S. PATENT DOCUMENTS

| | | | | |
|---|---|---|---|---|
| 5,328,810 A | * | 7/1994 | Lowrey | H01L 21/0271 148/DIG. 106 |
| 8,753,940 B1 | * | 6/2014 | Wei | H01L 21/845 257/E21.429 |
| 8,932,961 B2 | * | 1/2015 | Mehta | H01L 21/31144 257/E21.219 |
| 9,484,258 B1 | * | 11/2016 | Kim | H01L 21/76811 |
| 9,607,985 B1 | * | 3/2017 | Tseng | H01L 27/0886 |
| 9,881,794 B1 | * | 1/2018 | Su | H01L 21/0332 |
| 9,960,077 B1 | * | 5/2018 | Zang | H01L 21/76264 |
| 2010/0144153 A1 | * | 6/2010 | Sills | G03F 7/0035 438/696 |
| 2012/0282778 A1 | * | 11/2012 | Light | H01L 21/0337 438/703 |
| 2013/0171574 A1 | * | 7/2013 | Xu | G03F 7/38 430/325 |
| 2013/0277759 A1 | * | 10/2013 | Chen | H01L 21/823431 257/397 |
| 2013/0309871 A1 | * | 11/2013 | DeVilliers | H01L 21/0273 438/703 |
| 2014/0138800 A1 | * | 5/2014 | He | H01L 29/02 257/632 |
| 2014/0193974 A1 | * | 7/2014 | Lee | H01L 21/76816 438/669 |
| 2015/0048430 A1 | * | 2/2015 | He | H01L 21/31111 257/288 |
| 2015/0111380 A1 | * | 4/2015 | Chang | H01L 21/0337 438/674 |

(Continued)

*Primary Examiner* — Mohammad M Hoque
(74) *Attorney, Agent, or Firm* — Scully Scott Murphy and Presser; Frank Digiglio

(57) ABSTRACT

A single critical mask process flow and associated structure eliminate the formation of narrow polysilicon defects at the ends of polysilicon gate arrays, and obviate the need to implement complicated ground rules and post-design fill methods to avoid generation of the defects.

12 Claims, 8 Drawing Sheets

(56) References Cited

U.S. PATENT DOCUMENTS

| | | | |
|---|---|---|---|
| 2015/0132962 A1* | 5/2015 | Hu | H01L 21/0337 |
| | | | 438/703 |
| 2015/0137204 A1* | 5/2015 | Wang | H01L 27/11524 |
| | | | 257/314 |
| 2015/0145065 A1* | 5/2015 | Kanakasabapathy | |
| | | | H01L 27/0886 |
| | | | 257/401 |
| 2015/0155171 A1* | 6/2015 | Chang | H01L 21/0338 |
| | | | 438/703 |
| 2016/0013103 A1* | 1/2016 | Huang | H01L 21/0332 |
| | | | 438/666 |
| 2016/0133477 A1* | 5/2016 | Trefonas | H01L 21/0273 |
| | | | 257/618 |
| 2016/0181100 A1* | 6/2016 | deVilliers | H01L 21/0337 |
| | | | 438/702 |
| 2016/0260639 A1* | 9/2016 | Tsujita | H01L 21/0273 |
| 2016/0365311 A1* | 12/2016 | Hung | H01L 21/32139 |
| 2017/0025519 A1* | 1/2017 | Liao | H01L 29/66553 |
| 2017/0092506 A1* | 3/2017 | deVilliers | H01L 21/0337 |
| 2017/0117150 A1* | 4/2017 | Liao | H01L 29/66553 |
| 2017/0117177 A1* | 4/2017 | Briggs | H01L 21/76897 |
| 2017/0123314 A1* | 5/2017 | Kaur | G03F 7/405 |
| 2017/0261850 A1* | 9/2017 | Stowers | G03F 7/0035 |
| 2017/0288040 A1* | 10/2017 | Augendre | H01L 29/66795 |
| 2018/0019316 A1* | 1/2018 | Cheng | H01L 21/823418 |

* cited by examiner

SUBSTANTIALLY DEFECT-FREE POLYSILICON GATE ARRAYS

BACKGROUND

The present application relates generally to the manufacture of semiconductor devices, and more specifically to a multi-patterning method for forming polysilicon gate arrays.

Microelectronic circuit fabrication involves a series of photolithography masking steps for patterning of device structures. In advanced logic circuits and DRAM architectures, for example, fabrication process complexity can include more than one critical mask per level. However, minimization of critical masks is desired for manufacturing cost control.

Sidewall spacer double patterning or self-aligned double patterning (SADP) is a recently-developed paradigm for lithographic roadmaps. Rather than using lithography as the principal method for generating device features, however, the role of lithography is the generation of a mandrel (i.e., a pre-pattern) that will form the basis for subsequently formed patterns with varying degrees of density multiplication.

Disadvantageously associated with mandrel-based pattern definition of an array of features are defects related to the end-of-the-line disruption in the repeat symmetry of the array, i.e., isolated narrow features at the end of the line. Accordingly, it would advantageous to develop a double patterning method and associated structures that reduce the number of critical mask steps while eliminating the formation of defects and defect-inducing features at array ends.

SUMMARY

In various embodiments, gate masks for both narrow (PC) and wide (PB) gates can be patterned with one critical mask and one non-critical mask instead of two critical masks, while obviating the formation of a narrow, defect-prone polysilicon line (PC) at the end of the PC/PB array. Various embodiments include a modification to the shape of the non-critical mask to generate a wide, non-defect-prone polysilicon line (PB) at the end of the array. The revised patterning scheme can be implemented without complicated ground rules or a complicated post-design fill deck.

In accordance with embodiments of the present application, a method of forming a semiconductor structure includes forming a polysilicon layer over a semiconductor substrate and forming an array of mandrels directly over the polysilicon layer, where the array includes a pair of end mandrels each having and inner and an outer sidewall.

A conformal layer of a spacer material is deposited over the array of mandrels, and a dielectric layer is deposited over the conformal layer and between the mandrels. A masking layer is formed over the dielectric layer, such that portions of the masking layer are spaced laterally from the outer sidewall of each of the end mandrels along a direction parallel to a widthwise direction (W) of the mandrels.

According to further embodiments, a method of forming a semiconductor structure includes forming a semiconductor layer over a substrate, and forming an array of mandrels directly over the semiconductor layer, where the array including an end mandrel having inner and outer sidewalls. A conformal layer of a spacer material is deposited over the array of mandrels and a dielectric layer is deposited over the conformal layer and between the mandrels. A masking layer is formed over the dielectric layer, such that portions of the masking layer are spaced laterally from the outer sidewall of the end mandrel.

A further method of forming a semiconductor structure includes forming a semiconductor layer over a substrate, and forming an array of mandrels over the semiconductor layer, where the array includes an end mandrel having inner and outer sidewalls. A conformal layer of a spacer material is deposited over the array of mandrels, and a dielectric layer is deposited over the conformal layer and between the mandrels. A masking layer is formed over the dielectric layer, where portions of the masking layer are spaced laterally from the outer sidewall of the end mandrel. Using the masking layer as a mask, the dielectric layer is etched to form a patterned layer of dielectric material, where portions of the patterned layer of dielectric material are spaced laterally from the outer sidewall of the end mandrel.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
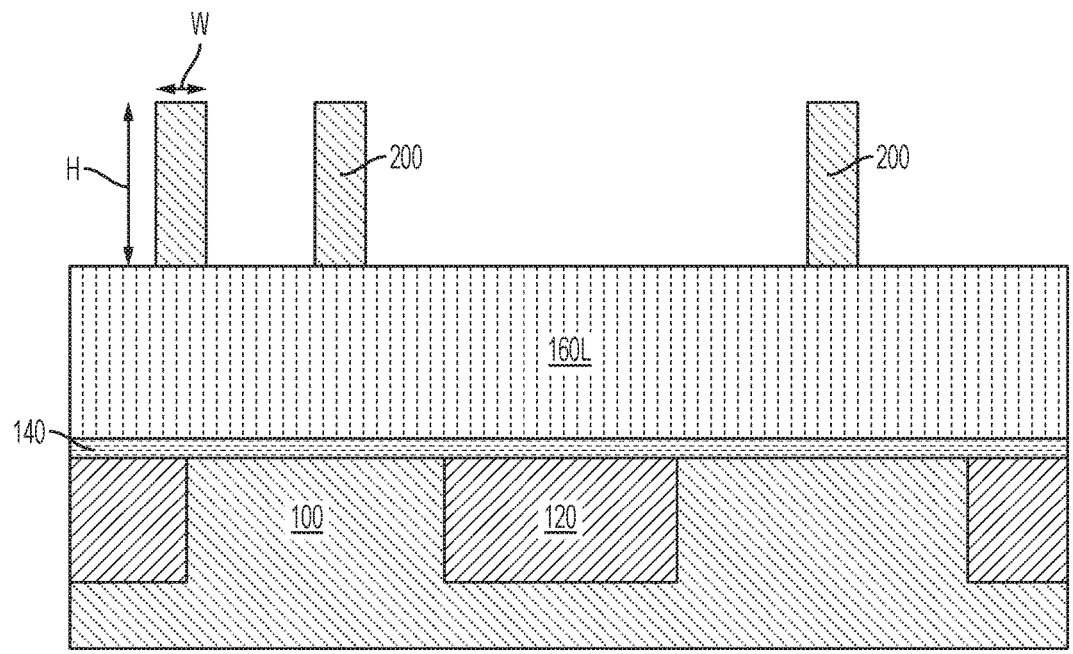
FIG. 1 is a schematic cross-sectional diagram showing a plurality of mandrels formed on a sacrificial polysilicon layer over a semiconductor substrate.

Reference will now be made in greater detail to various embodiments of the subject matter of the present application, some embodiments of which are illustrated in the accompanying drawings. The same reference numerals will be used throughout the drawings to refer to the same or similar parts.

A new integration process is introduced in which one critical mask is used to define a sacrificial polysilicon gate array including both wide (PB) and narrow (PC) gate patterns. The sacrificial gate array can be used in conjunction with a replacement metal gate (RMG) module to form transistor structures, as described further below. Using a single critical mask simplifies the number of process steps used and reduces cost.

During pattern transfer into the underlying sacrificial polysilicon layer, isolated narrow PC lines are prone to collapse and form defects. The process also eliminates the formation of end-of-the-line defects, which improves device reliability and performance. In certain embodiments, locating wider PB features next to narrower PC features provides support for the polysilicon structure and avoids collapse.

As used herein, a narrow gate mask (PC) has a width ranging from 15 to 40 nm, e.g., 15, 20, 25, 30, 35 or 40, including ranges between any of the foregoing values. It will be appreciated that conventional photolithography may be inadequate to directly pattern some narrow gate structures. A wide gate mask (PB) has a width ranging from 50 to 200 nm e.g., 50, 75, 100, 125, 150, 175 or 200 nm, including ranges between any of the foregoing values.

Embodiments of the disclosure relate to a method of forming features on a substrate using a self-aligned double patterning (SADP) process. According to an exemplary method, a conformal spacer layer is formed over a plurality of sacrificial mandrels patterned near the optical resolution of a photolithography system using a high-resolution, critical photomask. A hard mask layer is formed over the spacer layer and between adjacent mandrels and patterned using a non-critical mask.

An anisotropic etch of the spacer layer followed by removal of the mandrels results in an array of wide and narrow sacrificial gate patterns having wide polysilicon line (PB) terminations where the narrow gate (PC) patterns are supported or otherwise protected by the hard mask layer. The polysilicon layer is then etched to extend the gate patterns into the polysilicon layer. A replacement metal gate process flow is used to form gate stacks, which may include both functional and non-functional gates over the semiconductor substrate.

As will be appreciated, the disclosed process avoids the formation of isolated, narrow polysilicon (PC) lines, which are prone to collapse and generate defects or undesirable etch profiles that adversely affect device reliability and throughput.

Self-aligned double patterning (SADP) can extend the capabilities of photolithographic techniques beyond their minimum resolution or pitch. A SADP method in conjunction with various embodiments is illustrated with reference to FIGS. 1-10.

Referring to FIG. 1, raised structures 200 are formed from a sacrificial layer over a semiconductor substrate 100, i.e., directly over a sacrificial polysilicon layer 160L disposed above the substrate 100, using photo-lithography and etching techniques.

The semiconductor substrate 100 may be a bulk substrate or a composite substrate such as a semiconductor-on-insulator (SOI) substrate. Although not shown, the semiconductor substrate 100 may include various device structures, such as the source, drain and channel regions of an exemplary transistor, and may further include isolation regions such as shallow trench isolation (STI) regions 120 between adjacent devices, as is appreciated by one skilled in the art.

The raised structures 200, also referred to herein as mandrels, are arrayed at an inter-mandrel spacing near the optical resolution of a photolithography system using a critical, high-resolution photomask. In forming the mandrels, according to certain embodiments, one or more patterned masks (not shown) such as one or more patterned photoresist layers are formed over the layer of mandrel-forming material. The one or more patterned photoresist layers may include an underlying optical planarization layer (OPL). The OPL layer may be an organic material that is not photosensitive. As is know to those skilled in the art, the one or more patterned photoresist layers are used as an etch mask to pattern and etch the exposed mandrel-forming layer to form the mandrels 200. The exposed mandrel-forming layer may be etched using conventional etching processes, such as reactive ion etching (RIE). The one or more photoresist layers are thereafter removed.

Mandrels 200 may be formed from any suitable material, including dielectric materials such as silicon dioxide, silicon nitride, or silicon oxynitride, as well as combinations thereof. Mandrels 200 may have any suitable dimensions. Exemplary mandrels 200 have a height (H) of 50 to 500 nm, e.g., 50, 100, 200, 300, 400 or 500 nm, including ranges between any of the foregoing values, and a width (W) of 20 to 100 nm, e.g., 20, 40, 50 or 100 nm, including ranges between any of the foregoing values. An "array" of mandrels may include any integral number of mandrels, N, where $N \geq 2$.

Within an array, the two or more mandrels may be spaced apart from one another by an intra-mandrel spacing, or pitch, along a first direction. In various embodiments, the intra-mandrel spacing may be constant across the array. For instance, the pitch within an array may be within a range of 20 to 100 nm, for example. As will be appreciated, a pair of mandrels located at respective opposing ends of the array, i.e., along the first direction, terminate the array. Each mandrel at the end of an array is spaced apart from only one adjacent mandrel within the array by the intra-mandrel spacing.

Figure 2:
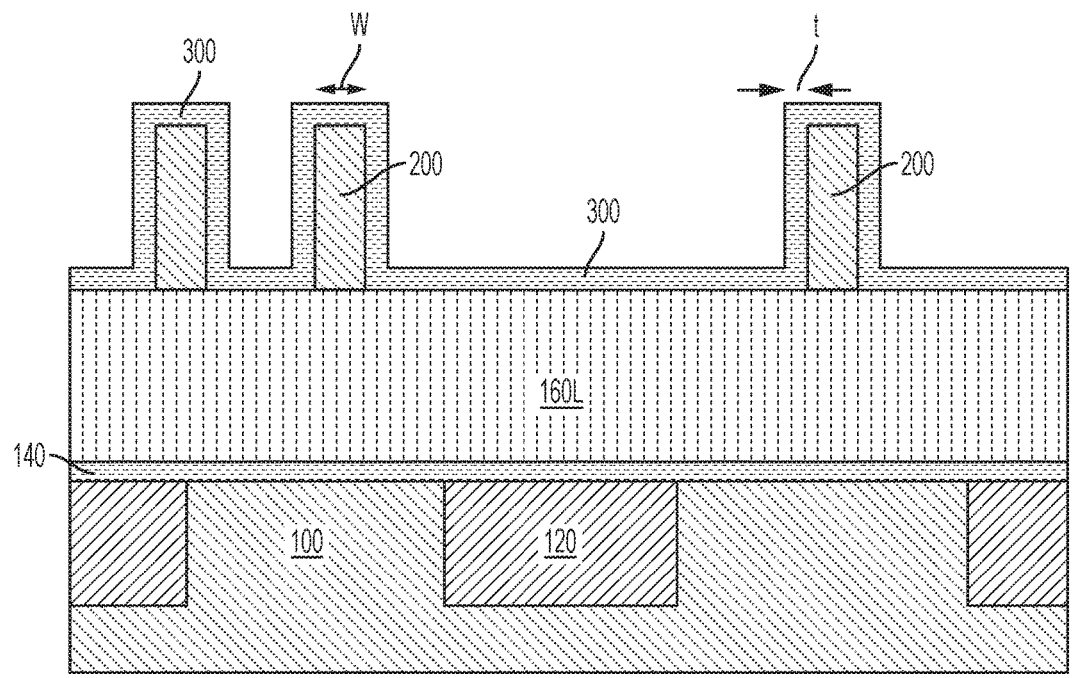
FIG. 2 depicts the formation of a conformal spacer layer over the mandrels.

Referring to FIG. 2, a spacer layer 300 is formed over the mandrels 200. The spacer layer 300 may be formed by blanket deposition of a conformal dielectric thin film, such as silicon nitride, silicon dioxide, silicon oxynitride, or combinations thereof. In certain embodiments, the spacer layer is a silicon nitride layer formed using a low pressure chemical vapor deposition (LPCVD) process.

The spacer layer 300 may be deposited to substantially equal thicknesses on opposing vertical surfaces of the mandrels 200, as well as on horizontal surfaces, such as top surfaces of the mandrels 200. By way of example, the thickness (t) of the spacer layer 300 may range from 10 to 50 nm, e.g., 10, 20, 30, 40 or 50 nm, including ranges between any of the foregoing values, although lesser and greater thicknesses are contemplated. In certain embodiments, the spacer layer 300 may have a sidewall thickness (t) equal to 10 to 50% of the width (W) of the mandrel, e.g., 10, 20, 30, 40 or 50%, including ranges between any of the foregoing values. In various embodiments, the mandrels 200 and the spacer layer 300 are formed from dissimilar materials that may be etched selectively to one another. For example, mandrels 200 may comprise silicon oxide and spacer layer 300 may comprise silicon nitride.

As used herein, "horizontal" refers to a general direction along a primary surface of a substrate, and "vertical" is a directly generally orthogonal thereto. Furthermore, "vertical" and "horizontal" are generally perpendicular directions relative to one another independent of orientation of the substrate in three-dimensional space.

Figure 3:
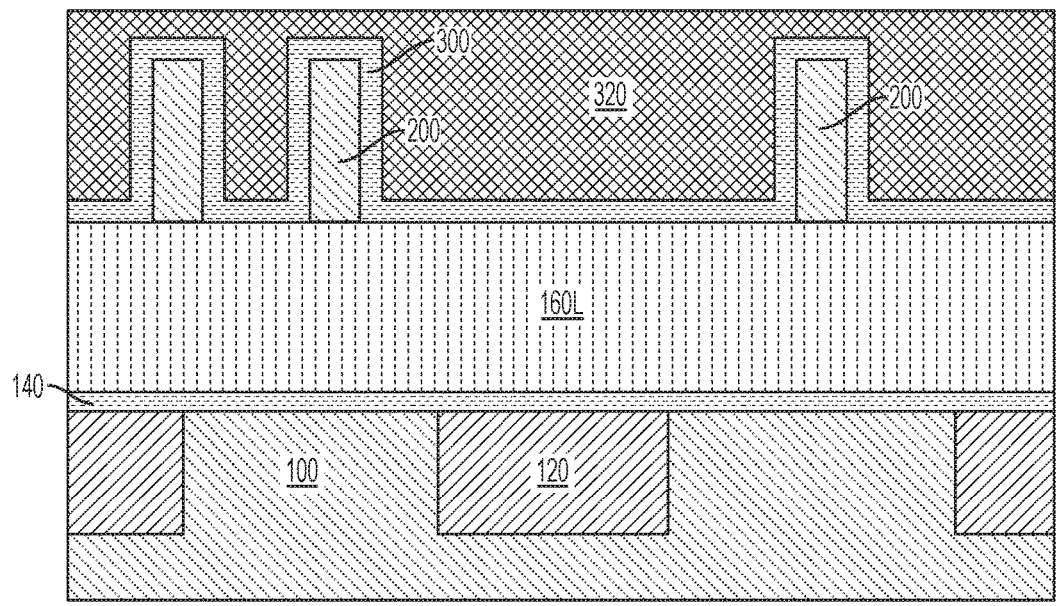
FIG. 3 shows the deposition of a hard mask layer over the conformal spacer layer and between adjacent mandrels.

Referring to FIG. 3, a hard mask layer 320 is deposited over the conformal spacer layer 300 to fill the space between adjacent mandrels 200. The hard mask layer 320 may be a self-planarizing layer, or may be planarized, for example, by chemical mechanical polishing. For instance, the hard mask layer 320 may be spun-on to fill the space between adjacent mandrels. In the illustrated embodiment, a top surface of the hard mask layer 320 lies above a top surface of the spacer layer 300. The hard mask layer 320 may comprise an inorganic photoresist including, e.g., hafnium oxide, which has a high chemical stability compared to polymer-based photoresists.

Figure 4:
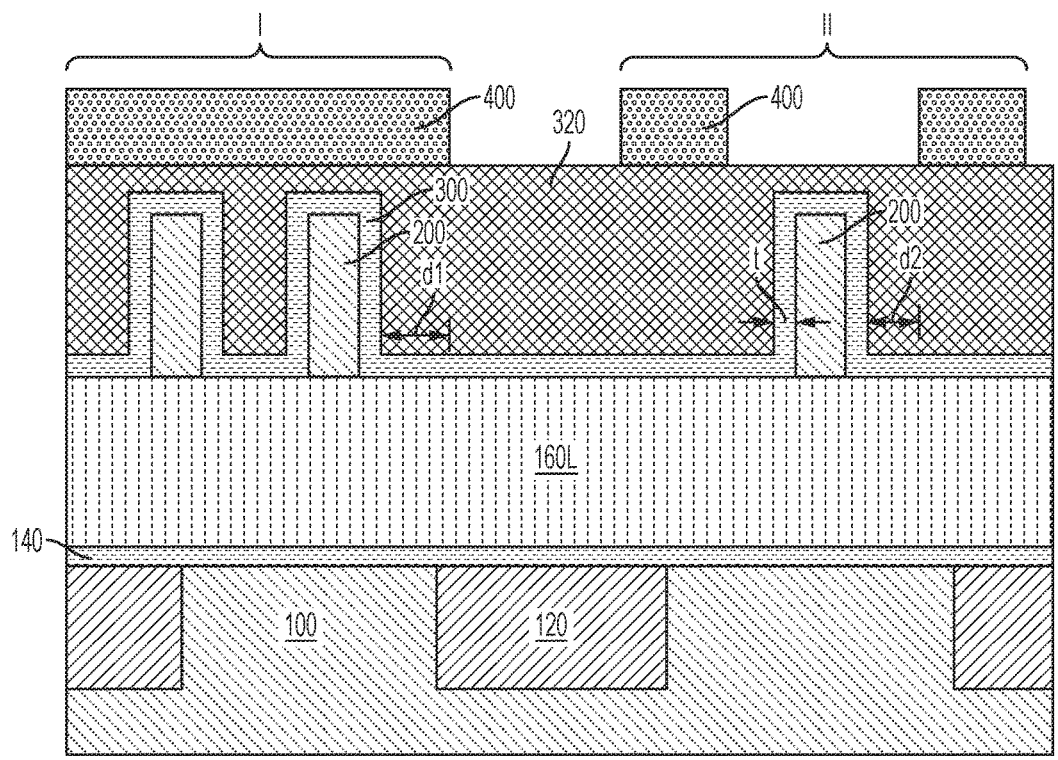
FIG. 4 shows a patterned photoresist layer formed over the hard mask layer according to various embodiments.

Referring to FIG. 4, a photoresist layer 400, i.e., masking layer, is formed over the hard mask layer 320 and patterned, e.g., using a non-critical mask, according to various embodiments. As illustrated, within a first region (I), a contiguous portion of the patterned photoresist layer 400 completely overlies at least a pair of adjacent mandrels 200 within an array of mandrels and extends laterally from sidewalls of the mandrels over the hard mask layer 320. According to various embodiments, the patterned photoresist layer 400 completely overlies a mandrel located at the end of an array. For instance, a contiguous portion of the patterned photoresist layer may completely overlie two adjacent mandrels and extend laterally from outer sidewalls of each of the pair of mandrels over the hard mask layer 320.

At the end of the array, the lateral extent (d1) of the photoresist layer with respect to the conformal spacer 300 of the underlying mandrel may be 10 to 100 nm, e.g., 10, 20, 50 or 100 nm, including ranges between any of the foregoing values. As will be appreciated, the overlapped portion of the hard mask 320 will cooperate with the abutting sidewall spacer 300 at the end of the array to define a relatively wide (PB) gate mask having a width equal to (t+d1). Within the first region (I), laterally displaced from the end of the array of mandrels, a wide (PB) gate mask will be defined having a width equal to the inter-mandrel spacing.

Although for simplicity the illustrated embodiment depicts only two mandrels within the first region (I), the number of mandrels per array and the number of arrays may be selected for a particular function of application. For instance, the first region (I) and the second region (II) described below may be configured for logic and/or memory functionality.

Within a second region (II), the photoresist layer 400 overlies hard mask layer 320 without overlying a mandrel 200. That is, the photoresist pattern is displaced laterally from isolated mandrel 200 as well as the spacer layer formed over opposing sidewalls of the isolated mandrel. In certain embodiments, as shown in FIG. 4, the photoresist layer 400 within the second region (II) is patterned to overlie the hard mask layer 320 laterally spaced from each opposing sidewall surface of the isolated mandrel 200. The extent of the lateral offset, i.e., gap, (d2) of the photoresist layer with respect to the conformal spacer 300 of the underlying mandrel 200 may be less than the mandrel width (W). For example, the lateral offset (d2) may range from 10 to 100 nm, e.g., 10, 20, 50 or 100 nm, including ranges between any of the foregoing values.

In embodiments where the patterned photoresist layer 400 overlies the hard mask layer 320 on both sides of a mandrel, the extent of the lateral offset (d2) of the photoresist layer with respect to the conformal spacer 300 on each side of the mandrel 200 may be equal or unequal.

As will be appreciated, within the second region (II), the sidewall spacers of the isolated mandrel 200 will each form a narrow (PC) gate mask having a width equal to (t), while the hard mask 320 will be patterned to form adjacent gate masks (PB) having a width equal to the width of the patterned photoresist layer.

After patterning the photoresist layer 400, one or more pattern transfer etching processes can be used to remove exposed portions of the hard mask layer 320. As used herein, various pattern transfer etching processes comprise an anisotropic etch. In certain embodiments, a dry etching process such as, for example, reactive ion etching can be used. In other embodiments, a wet chemical etchant can be used. In still further embodiments, a combination of dry etching and wet etching can be used.

In addition to the directional nature of an etch process, a factor associated with etching is etch selectivity. Etch selectivity refers to the ratio of etch rates of two different materials undergoing etching. In various scenarios, it is desired that a first material be etched faster than a second material.

A plasma reactor may be used to perform various etch processes on a semiconductor wafer in microelectronic fabrication including reactive ion etching. In such a process, a substrate is placed inside a vacuum chamber of the reactor and process gases, including etchant gases, are introduced into the chamber. The gases are energized to ignite and maintain a plasma. Depending upon the composition of the gases from which the plasma is formed, the plasma may be used to etch a particular material from the substrate. Selective etching processes have also been developed which depend more upon chemical effects. These processes are often described as reactive ion etching (RIE).

Plasma can be produced in various types of plasma reactors. Such plasma reactors typically have energy sources which use RF energy, microwave energy, magnetic fields, etc., to produce a medium to high density plasma. During one or more of the disclosed etch processes, including etching of the hard mask layer 320, the plasma generated may comprise any plasma capable of being produced in a vacuum chamber, for example, by providing a grounded electrode and a second electrode connected to a source of RF power. Etching of the hard mask 320 may be performed using a $SiF_6/O_2$ plasma.

Thus, referring still to FIG. 4, a semiconductor structure includes a polysilicon layer disposed over a semiconductor substrate, an array of mandrels disposed directly over the polysilicon layer, the array including a pair of end mandrels having inner and outer sidewalls and one or more mandrels between the end mandrels. Inner sidewalls of the end mandrels face the array of mandrels. Outer sidewalls of the end mandrels face away from the array of mandrels. A conformal layer of a spacer material is disposed over the array of mandrels, and a dielectric layer is disposed over the conformal layer and between the mandrels. A first masking layer is disposed over the array of mandrels, such that the first masking layer extends laterally over the dielectric layer from the outer sidewalls of the end mandrels in a direction parallel to a widthwise direction of the mandrels.

Figure 5:
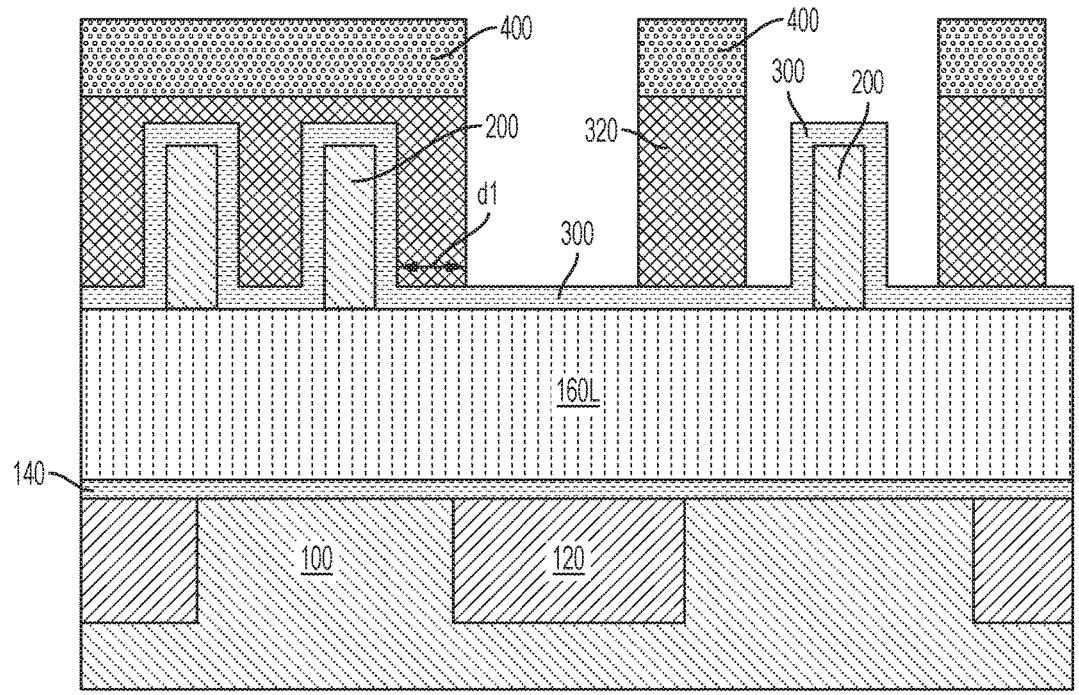
FIG. 5 depicts the anisotropic etching of exposed portions of the hard mask.

FIG. 5 depicts a device structure at an intermediate stage of fabrication following the anisotropic etching of exposed portions of the hard mask layer 320. Within the first region of the device, etching the hard mask layer 320 using the masking layer 400 as a mask forms a patterned layer of hard mask layer 320 that extends laterally a distance d1 from sidewalls of the conformal layer 300 in a direction parallel to the widthwise direction (W) of the mandrels. Within the second region of the device, etching the hard mask layer 320 using the masking layer 400 as a mask forms a patterned layer of hard mask layer 320 that is laterally offset by a distance d2 from sidewalls of the conformal.

Next, any residual photoresist may be removed using, for example, a standard photoresist stripping process such as an ashing process. Ashing may be performed by introducing $O_2$ or $O_3$ into a plasma. The ashing process can also involve one or more halogen-containing gases.

Figure 6:
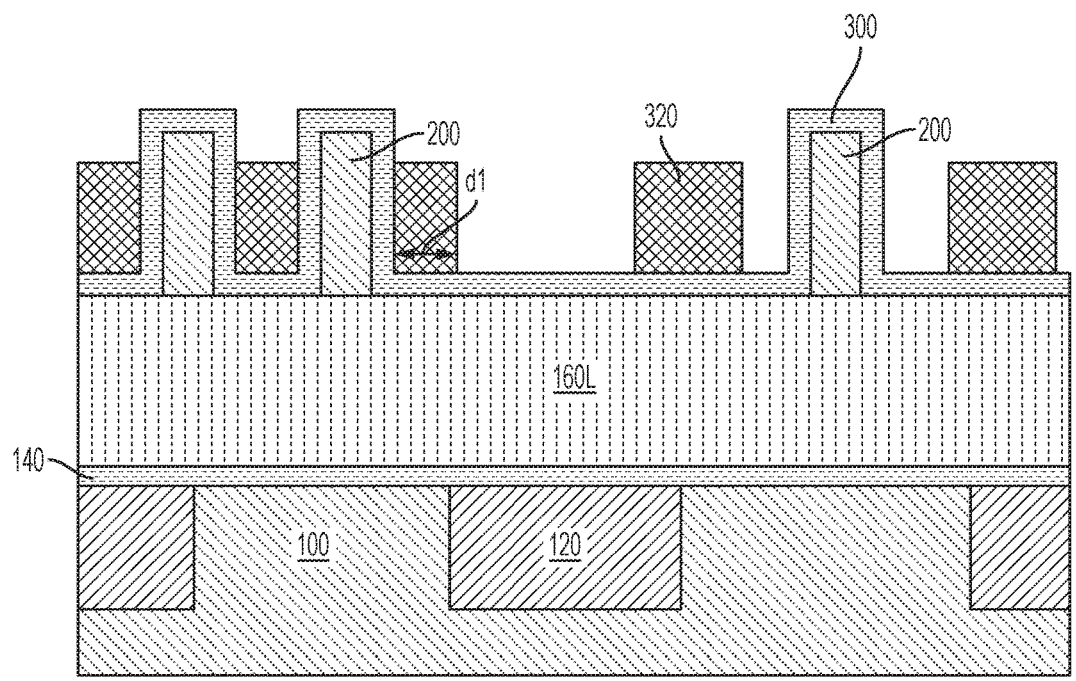
FIG. 6 shows removal of the photo resist layer and concomitant recessing of the hard mask.

Referring to FIG. 6, removal of the photoresist 400 may partially etch remaining portions of hard mask layer 320, which recesses a top surface of the patterned hard mask layer 320 below a top surface of the mandrels 200.

Figure 7:
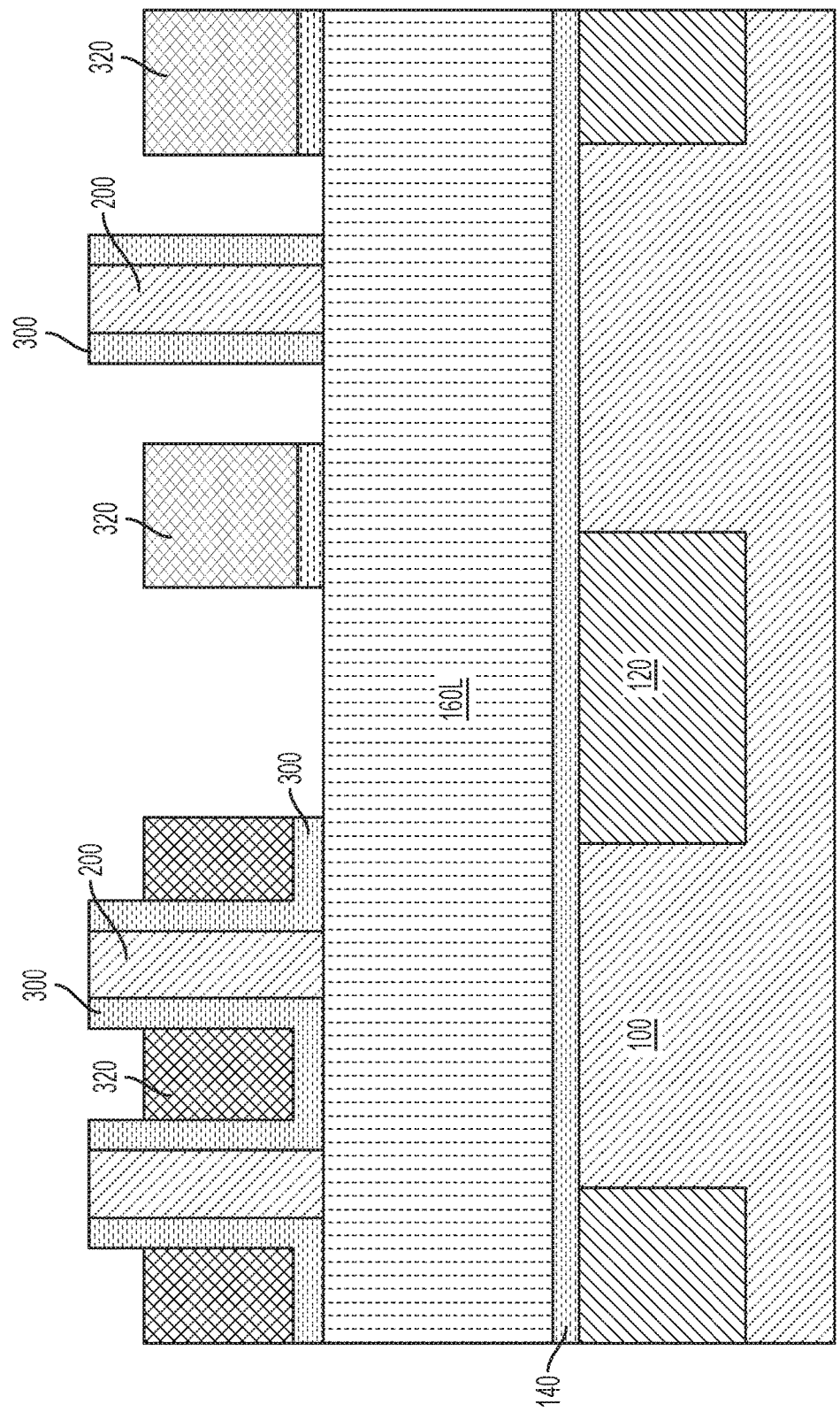
FIG. 7 depicts the anisotropic etching of the spacer layer to expose portions of the sacrificial polysilicon layer.

Referring to FIG. 7, the spacer layer 300 is then anisotropically etched using, for example, plasma etching or reactive ion etching. The anisotropic etch removes the spacer layer material from horizontal surfaces, such as top surfaces of the mandrels, and leaves the spacer layer material over the mandrel sidewalls. Thus, the anisotropic etch step creates a thin mask on each sidewall of the mandrels 200. Where the spacer layer 300 is unprotected by hard mask layer 320, the anisotropic etching of the spacer layer also exposes portions of the sacrificial polysilicon layer 160L.

Figure 8A:
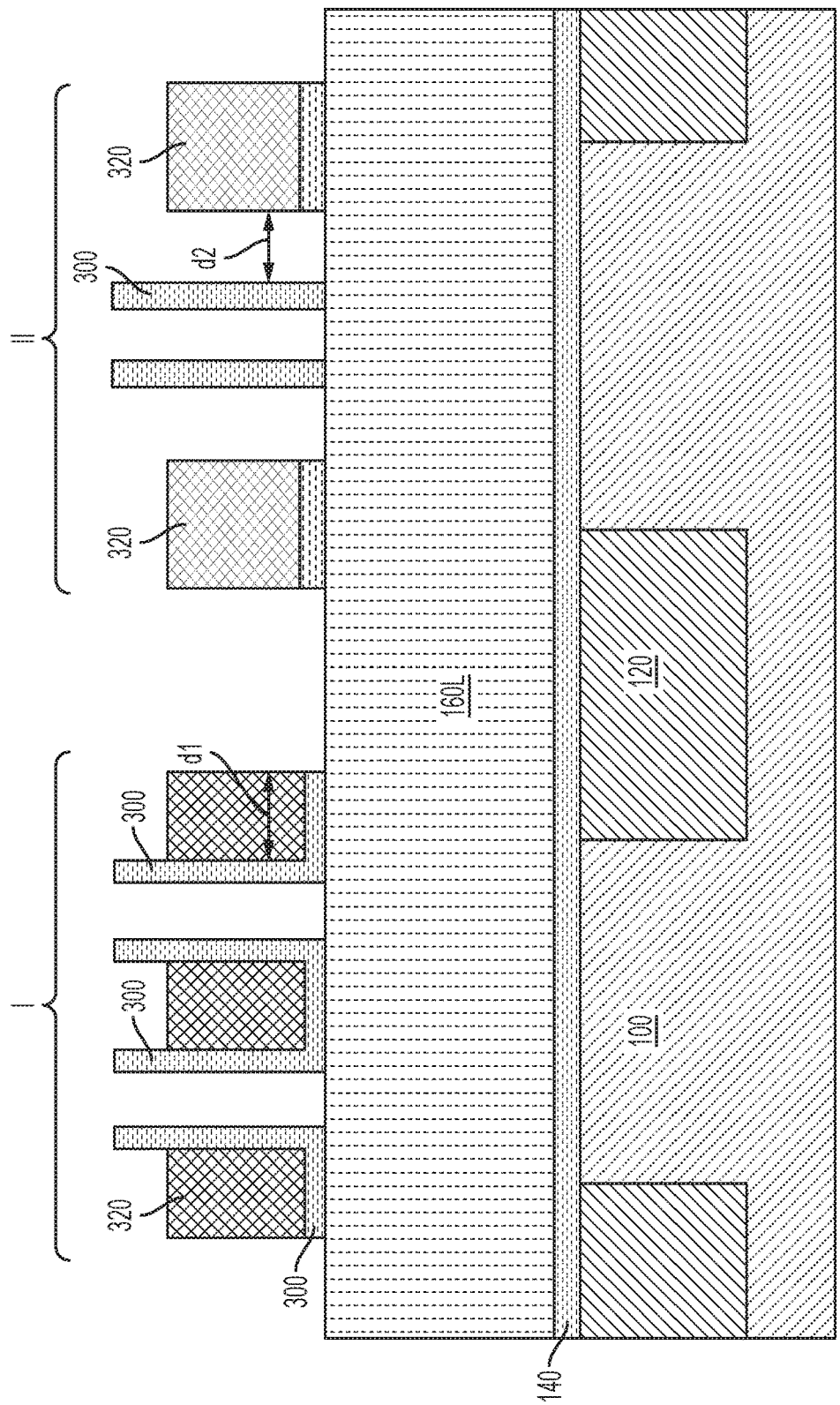
FIG. 8A shows selective removal of the mandrels to simultaneously form wide and narrow gate patterns over the sacrificial polysilicon layer.
Figure 8B:
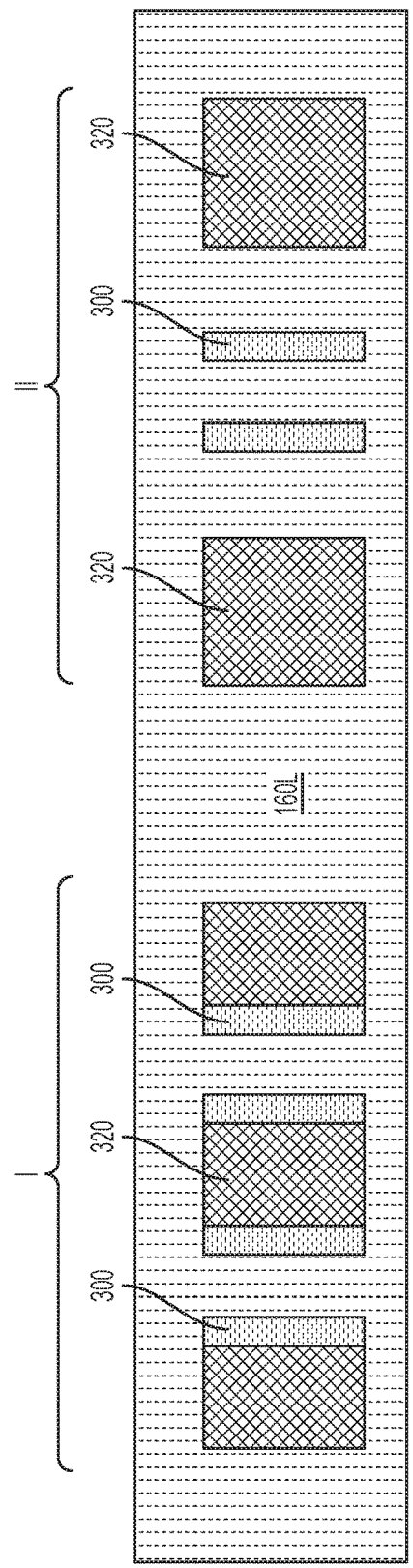
FIG. 8B is a top-down plan view of the structure shown in FIG. 8A.

Mandrels 200 may then be removed, leaving behind hard mask spacers 300, which may be used as an etch mask to transfer the pattern of the spacers 300 into the sacrificial polysilicon layer 160L. The exposed mandrels are removed using a selective etch that etches the mandrel material relative to the spacer material. The cross-sectional view of FIG. 8A shows selective removal of the mandrels to form wide and narrow structures over the sacrificial polysilicon layer that will be used in conjunction with a replacement metal gate (RMG) module to form gate stacks over the semiconductor substrate. The narrow structures are formed using sidewall spacers 300, while the wide structures include patterned portions of the hard mask layer 320 and optionally abutting sidewall spacers 300. FIG. 8B is a top-down plan view of the structure shown in FIG. 8A. As will be appreciated, spacers 300 may be directly or indirectly supported by remaining portions of hard mask layer 320.

Referring to FIG. 8A, within the first region (I), each vertically-oriented portion of spacer layer 300 is directly contacted along one sidewall surface thereof by a remaining portion of hard mask layer 320. By providing a portion of the hard mask layer 320 directly in contact with the spacer layers 300, isolated spacer layers can be eliminated from the pattern array. The first region (I) thus includes a plurality of wide (PB) gate patterns, which may be suitable for manufacturing high voltage devices, for example.

The second region (II) includes a plurality of narrow (PC) and wide (PB) gate patterns. Narrow gates may be used to form logic devices, for example. Within the second region (II), remaining portions of hard mask layer 320 are located proximate to vertically-oriented spacers 300, which indirect support the spacers and inhibits their collapse. Locating wider PB features next to narrower PC features provides support for the later-formed polysilicon structure.

Within the first region (I), a portion of the hard mask 320 directly abuts and supports sidewall spacers 300 at each end of the array. Within the second region (II), a portion of the hard mask 320 is disposed proximate to sidewall spacers 300 (i.e., the hard mask is laterally offset from the sidewall spacers by a distance d2). Thus, in both the first and the second regions, the formation of isolated, unsupported narrow features is avoided.

Figure 9:
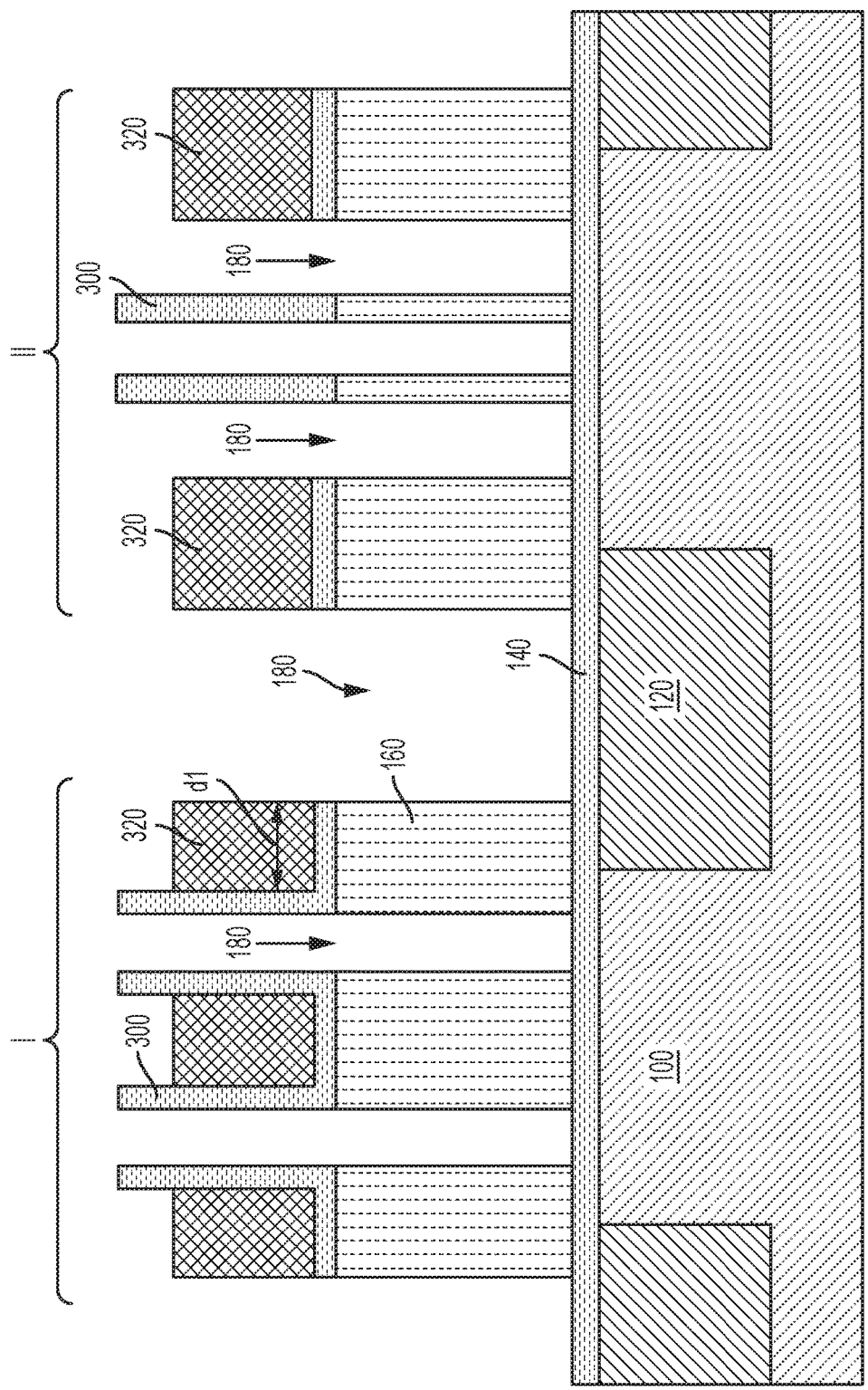
FIG. 9 shows etching of the sacrificial polysilicon layer to define gate patterns for a replacement metal gate (RMG) module.

Referring to FIG. 9, the patterned spacers 300 and patterned hard mask layer 320 cooperate to form an etch mask for the subsequent removal of unmasked portions of the polysilicon layer 160L to form cavities 180. That is, using spacers 300 and hard mask 320 as masking layers, an anisotropic etch of polysilicon layer 160L defines a patterned sacrificial gate 160 for a replacement metal gate (RMG) module. In certain embodiments, removal of the polysilicon layer is selective to sacrificial gate oxide layer 140, which can function as a etch stop and protect the semiconductor substrate during etching of the polysilicon. Sacrificial gate oxide layer 140 may be removed in a subsequent etch step.

An example chemistry for etching the polysilicon layer 160L includes a hydrogen-containing fluorocarbon gas, an oxygen-containing gas, and an optional carrier gas. The hydrogen-containing fluorocarbon gas can be at least one of $CH_3F$, $CH_2F_2$, $CHF_3$, $C_2H_4F_6$, the oxygen-containing gas may be $O_2$, $CO$, or $CO_2$, and the carrier gas may be He, Ne, Ar, Kr or Xe. An exemplary hydrogen-containing fluorocarbon gas is $CH_3F$ and an exemplary oxygen-containing gas is $O_2$, which can be delivered to the chamber at a $CH_3F:O_2$ flow rate ratio ranging from 1:1 to 1:4.

Figure 10:
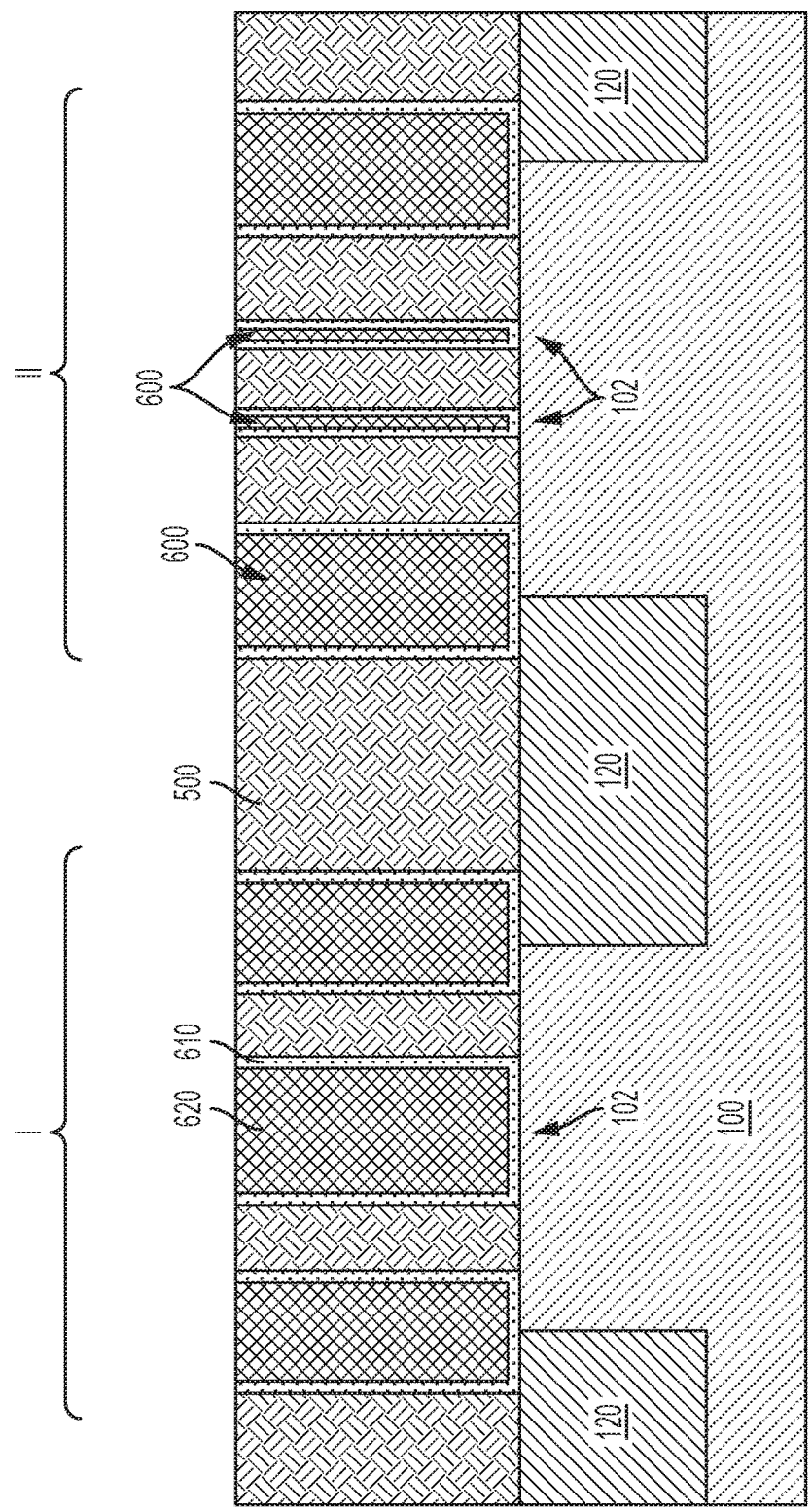
FIG. 10 shows a planarized device architecture according to various embodiments, including replacement metal gate structures formed over the semiconductor substrate.

Referring to FIG. 10, after etching the polysilicon layer 160L to define a patterned sacrificial gate 160, the spacers 300 and patterned hard mask 320 can be removed and cavities 180 back-filled with an interlayer dielectric 500. For instance, dielectric layer 500 may be formed within cavities between remaining portions of the polysilicon layer and over exposed surfaces of substrate 100, e.g., generally filling the cavities.

Then, a selective etch is used to remove the sacrificial gate 160 and exposed portions of the dielectric layer 140L, to expose the top surface of the substrate, e.g., within channel regions 102 thereof. The formation of a gate dielectric and a gate electrode can then be effected, for example, by deposition of a stack of a gate dielectric layer and one or more conductive layers within the cavity formed by removal of the sacrificial gate 160, and by a subsequent CMP step.

Referring still to FIG. 10, a gate stack is formed over exposed surfaces of the substrate 100 above channel regions. The gate stack 600 comprises a gate dielectric layer 610, and one or more conductive layers 620, such as a work function metal layer and a gate conductor. The gate stack 600 in certain embodiments may define a functional gate structure. As used herein, the term "functional gate structure" means a structure used to control current output, i.e., the flow of carriers in a channel, of a semiconducting device through electrical or magnetic fields. For instance, a functional gate structure in certain embodiments will entirely overlie the semiconductor substrate 100, while a non-functional (dummy) gate structure will partially overlie a shallow trench isolation (STI) region 120.

The gate dielectric layer 610 may be formed by conformally depositing a dielectric material by CVD or atomic layer deposition (ALD) over the sidewalls and the bottom surface of the gate cavity. Gate dielectric layer 610 may comprise silicon dioxide, silicon nitride, silicon oxynitride, a high-k dielectric, or other suitable material. As used herein, a "high-k" material has a dielectric constant greater than that of silicon dioxide.

A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing.

Subsequently, a work function metal layer is conformally deposited over the gate dielectric layer 610. The work function metal layer may include TiAlC, TaAlC, TiAl, Ti, or Al. The work function of the work function metal layer may range from 4.1 eV to 4.3 eV. The work function metal layer may be formed by a suitable deposition process such as, for example, CVD, PVD or ALD. The work function metal layer that is formed may have a thickness ranging from 1 nm to 10 nm, although lesser and greater thicknesses can also be employed.

A gate conductor layer is then formed over the work function metal layer to fill a remaining volume of the gate cavity. The gate conductor layer may include any conductive material including, for example, may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor layer may be formed by a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

Chemical mechanical polishing (CMP) may be used to remove overburden material and define the gate stacks 600. Chemical mechanical polishing is a material removal process that uses both chemical reactions and mechanical forces to remove material and planarize a surface. For clarity, the work function metal and the gate conductor are shown collectively as conductive layer 620.

Disclosed are methods for creating semiconductor structures, including arrays of semiconductor structures, as well as the resulting structures. In various embodiments, a semiconductor structure includes a polysilicon layer disposed over a semiconductor substrate, and a plurality of mandrels disposed directly over the polysilicon layer. A conformal layer of a spacer material is disposed over the plurality of mandrels, and a dielectric layer is disposed over the conformal layer and between the mandrels. The structure further includes a first masking layer disposed over a pair of adjacent mandrels, where the first masking layer extends laterally over the dielectric layer from sidewalls of the pair of adjacent mandrels in a direction parallel to a widthwise direction of the mandrels.

The various structural arrays may include a first region (I) and a second region (II). The first region (I) may be adapted, for example, for high voltage devices and include an array of relatively wide (~70 nm) gates terminated by narrower (<70 nm) gates. The second region (II) may be adapted for logic devices, for example, and include an array of relatively narrow (<20 nm, e.g., <16 nm) gates terminated by wider (~70 nm) gates.

As used herein, the singular forms "a," "an" and "the" include plural referents unless the context clearly dictates otherwise. Thus, for example, reference to a "mandrel" includes examples having two or more such "mandrels" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a fin that comprises a semiconductor material include embodiments where a fin consists essentially of a semiconductor material and embodiments where a fin consists of a semiconductor material.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:
   forming a polysilicon layer over a semiconductor substrate;
   forming an array of mandrels directly over the polysilicon layer, the array of mandrels including a pair of adjacent end mandrels each having a top surface, a bottom surface and sidewalls;
   depositing a conformal layer of a spacer material over the array of mandrels and between any two mandrels of the array;
   depositing a dielectric layer over the conformal layer and between any two mandrels of the array;
   forming a masking layer directly over the dielectric layer, wherein the masking layer overlies each of the pair of adjacent end mandrels, is separated from the conformal layer by the dielectric layer, and (i) the masking layer extends continuously from over the pair of adjacent end mandrels to over the dielectric layer spaced laterally from the sidewalls of each of the pair of adjacent end mandrels within a first region of the semiconductor substrate, (ii) the masking layer does not overlie at least one end mandrel within a second region of the semiconductor substrate;
   etching the dielectric layer within the first region of the semiconductor substrate using the masking layer as a mask to form a patterned layer of dielectric material extending laterally from sidewalls of the conformal layer disposed over the pair of adjacent end mandrels; and
   etching the dielectric layer within the second region of the semiconductor substrate using the masking layer as a mask to form another patterned layer of dielectric material laterally offset from sidewalls of the conformal layer disposed over the at least one end mandrel.

2. The method of claim 1, wherein a lateral extent of the patterned layer of dielectric material with respect to the conformal layer within the first region of the semiconductor substrate is 10 to 100 nm.

3. The method of claim 1, wherein a lateral extent of the offset of the patterned layer of dielectric material from sidewalls of the conformal layer disposed over the at least one end mandrel within the second region of the substrate is less than a width of the at least one end mandrel.

4. The method of claim 1, wherein the mandrels of the array comprise silicon dioxide.

5. The method of claim 1, wherein the spacer material comprises silicon nitride.

6. The method of claim 1, further comprising anisotropically etching the conformal layer to expose the mandrels of the array.

7. The method of claim 6, further comprising removing the exposed mandrels.

8. The method of claim 1, wherein the masking layer comprises a layer of photoresist.

9. The method of claim 1, wherein the dielectric layer comprises an inorganic photoresist.

10. The method of claim 1, wherein the dielectric layer comprises hafnium oxide.

11. A method of forming a semiconductor structure, comprising:

forming a semiconductor layer over a substrate;

forming an array of mandrels over the semiconductor layer, the array of mandrels including a pair of adjacent end mandrels each having a top surface, a bottom surface and sidewalls;

depositing a conformal layer of a spacer material over the array of mandrels and between any two mandrels of the array;

depositing a dielectric layer over the conformal layer and between any two mandrels of the array;

forming a masking layer directly over the dielectric layer, wherein the masking layer overlies each of the pair of adjacent end mandrels, is separated from the conformal layer by the dielectric layer, and (i) the masking layer extends continuously from over the pair of adjacent end mandrels to over the dielectric layer spaced laterally from the sidewalls of each of the pair of adjacent end mandrels within a first region of the substrate, (ii) the masking layer does not overlie at least one end mandrel within a second region of the substrate;

etching the dielectric layer within the first region of the substrate using the masking layer as a mask to form a patterned layer of dielectric material, wherein portions of the patterned layer of dielectric material are spaced laterally from the sidewalls of the pair of adjacent end mandrels; and etching the dielectric layer within the second region of the substrate using the masking layer as a mask to form another patterned layer of dielectric material laterally offset from sidewalls of the conformal layer disposed over the at least one end mandrel.

12. The method of claim 11, wherein the patterned layer of dielectric material directly contacts the conformal layer.

* * * * *